(12) United States Patent
Kuki et al.

(10) Patent No.: US 10,176,874 B2
(45) Date of Patent: Jan. 8, 2019

(54) STORAGE DEVICE AND METHOD OF CONTROLLING THE STORAGE DEVICE

(71) Applicant: TOSHIBA MEMORY CORPORATION, Tokyo (JP)

(72) Inventors: Tomohiro Kuki, Yokkaichi Mie (JP); Yasuhiro Shimura, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/409,296

(22) Filed: Jan. 18, 2017

(65) Prior Publication Data

US 2017/0271015 A1 Sep. 21, 2017

Related U.S. Application Data

(60) Provisional application No. 62/309,420, filed on Mar. 16, 2016.

(51) Int. Cl.
| | |
|---|---|
| *G11C 16/26* | (2006.01) |
| *G11C 16/10* | (2006.01) |
| *G11C 16/04* | (2006.01) |
| *G11C 16/08* | (2006.01) |
| *G11C 16/32* | (2006.01) |

(52) U.S. Cl.
CPC .......... *G11C 16/10* (2013.01); *G11C 16/0483* (2013.01); *G11C 16/08* (2013.01); *G11C 16/32* (2013.01); *G11C 16/26* (2013.01)

(58) Field of Classification Search
CPC .................................................. G11C 16/26
USPC ...................................................... 365/185.23
See application file for complete search history.

(56) References Cited

U.S. PATENT DOCUMENTS

| | | | |
|---|---|---|---|
| 7,295,478 B2 | 11/2007 | Wan et al. | |
| 7,859,902 B2 | 12/2010 | Maejima | |
| 8,854,896 B2 | 10/2014 | Hosono et al. | |
| 2014/0126291 A1 | 5/2014 | Mihnea et al. | |
| 2014/0247671 A1* | 9/2014 | Ito ......................... | G11C 16/26 |
| | | | 365/185.23 |

FOREIGN PATENT DOCUMENTS

| | | |
|---|---|---|
| JP | 2009-266946 A | 11/2009 |
| JP | 5334954 B2 | 11/2013 |
| JP | 2014075169 A | 4/2014 |
| WO | 2014074408 A2 | 5/2014 |

\* cited by examiner

*Primary Examiner* — Jason Lappas
(74) *Attorney, Agent, or Firm* — Patterson & Sheridan, LLP

(57) ABSTRACT

A storage device includes bit lines including a first bit line and a second bit line, memory units including a first memory string having memory cells connected in series, connected to the first bit line, and a second memory string having memory cells connected in series, connected to the second bit line, word lines each connected in common to a gate of a memory cell in the first string and a gate of a memory cell in the second string, and a controller configured to control voltages applied to the bit lines and the word lines during writing. When writing is performed on a selected memory cell of the first memory string, a first voltage is applied to a selected word line connected to the gate of the selected memory cell while a second voltage higher than a zero voltage is applied to the first bit line.

20 Claims, 12 Drawing Sheets

STORAGE DEVICE AND METHOD OF CONTROLLING THE STORAGE DEVICE

CROSS-REFERENCE TO RELATED APPLICATIONS

This application is based upon and claims the benefit of priority from U.S. Provisional Patent Application No. 62/309,420, filed on Mar. 16, 2016, the entire contents of which are incorporated herein by reference.

FIELD

Embodiments described herein relate generally to a storage device and a method of controlling the storage device.

BACKGROUND

A storage device in which memory cells are arranged in three dimensions is known.

DETAILED DESCRIPTION

In one embodiment, a storage device includes a plurality of bit lines including a first bit line and a second bit line, a plurality of memory units that are electrically connected in parallel between each of the plurality of bit lines and a source line, one of the memory units including a first memory string having a plurality of memory cells connected in series, connected to the first bit line, and a second memory string having a plurality of memory cells connected in series, connected to the second bit line, a plurality of word lines that are each connected in common to a gate of a memory cell in the first string and a gate of a memory cell in the second string, and a controller configured to control voltages applied to the bit lines and the word lines during a writing operation. When the writing operation is performed on a selected memory cell of the first memory string, a first voltage is applied to a selected word line that is connected to the gate of the selected memory cell while a second voltage higher than a zero voltage is applied to the first bit line.

A storage device and a method of controlling a storage device according to embodiments are described below with reference to the drawings. The numbers of elements described in the following are merely exemplary, and are not restrictive.

First Embodiment

Figure 1:
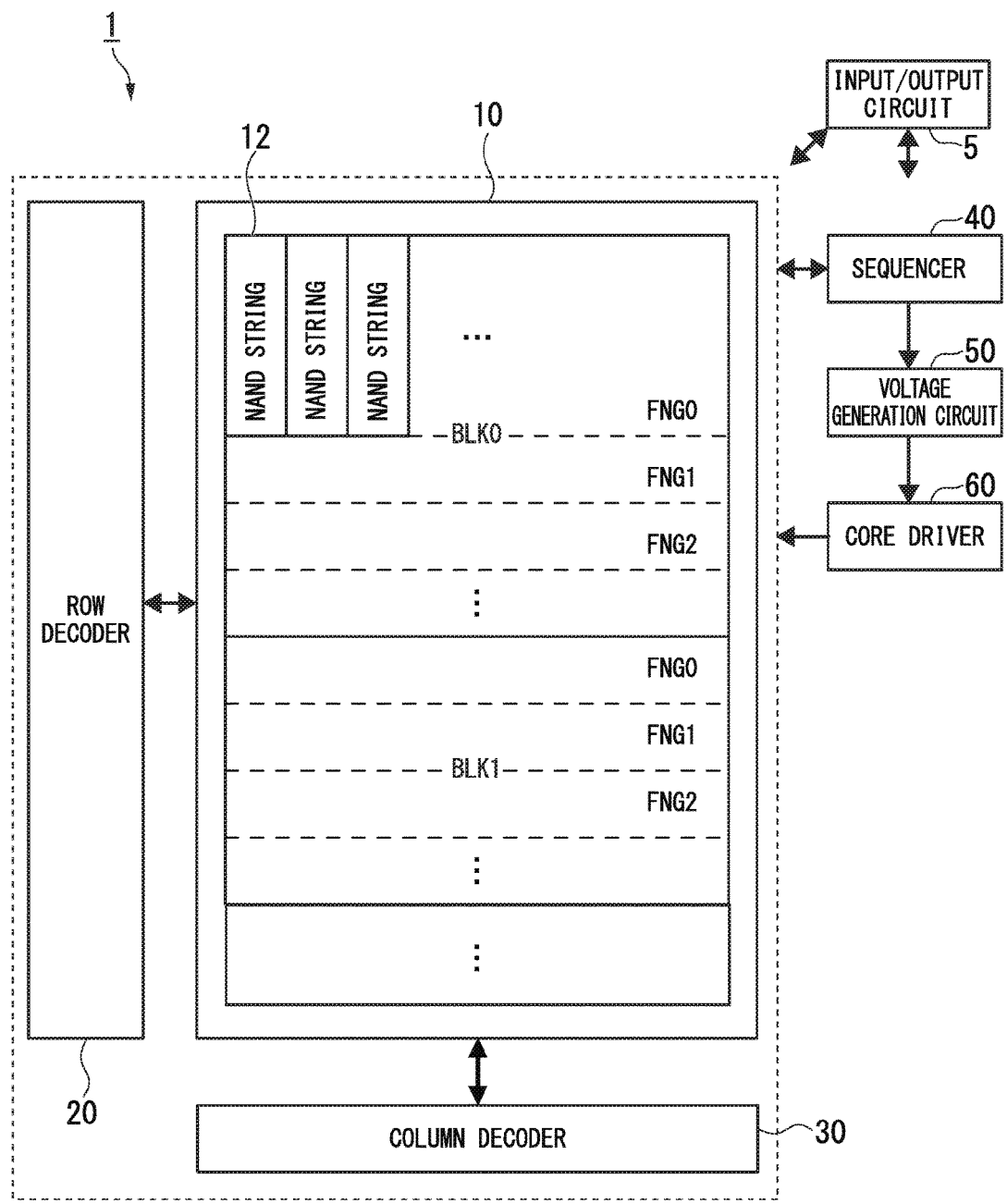
FIG. 1 schematically illustrates a storage device according to a first embodiment.

FIG. 1 schematically illustrates a storage device according to a first embodiment.

A storage device 1 shown in FIG. 1 includes an input/output circuit 5, a memory cell array 10, a row decoder 20, a column decoder 30, a sequencer 40, a voltage generation circuit 50, and a core driver 60.

The input/output circuit 5 is connected to a memory controller (not shown) that intermediates between a host (not shown) and the storage device 1. The input/output circuit 5 acquires from the memory controller, for example, commands, an address signal, data, and control signals and returns a response to the memory controller. In the description below, the term "connection" includes a physical connection and an electrical connection either or both.

The memory cell array 10 includes a plurality of blocks BLK (BLK0, BLK1, and so on). Each block BLK is a unit for data erasing, and all data in a block BLK is erased through a single erasing operation. Each block BLK includes a plurality of fingers FNG (FNG0, FNG1, FNG2, and so on). Each finger FNG includes a plurality of NAND string 12 (one example of memory units).

Each NAND string 12 has a three dimensional structure in which elements thereof are disposed in the form of a matrix, and each element extends in a direction intersecting with the matrix plane. The matrix disposition is one in which the elements thereof are arranged in a first direction and in a second direction that is perpendicular to the first direction. The matrix plane is the plane formed by the first direction and the second direction.

The row decoder 20 decodes an address received from the input/output circuit 5 and selects one select gate line or word line. The column decoder 30 decodes the address received from the input/output circuit 5 and selects one bit line.

The sequencer 40 controls the voltage generation circuit 50 and the core driver 60, in accordance with a sequence based on a command received from the input/output circuit 5. The voltage generation circuit 50 generates various voltages (potentials) in accordance with instructions from the sequencer 40. The core driver 60 uses the voltage generated by the voltage generation circuit 50 to apply a voltage, via the row decoder 20 or the column decoder 30, to a word line, a select gate line, a gate line, a bit line, or a source line.

Figure 2:
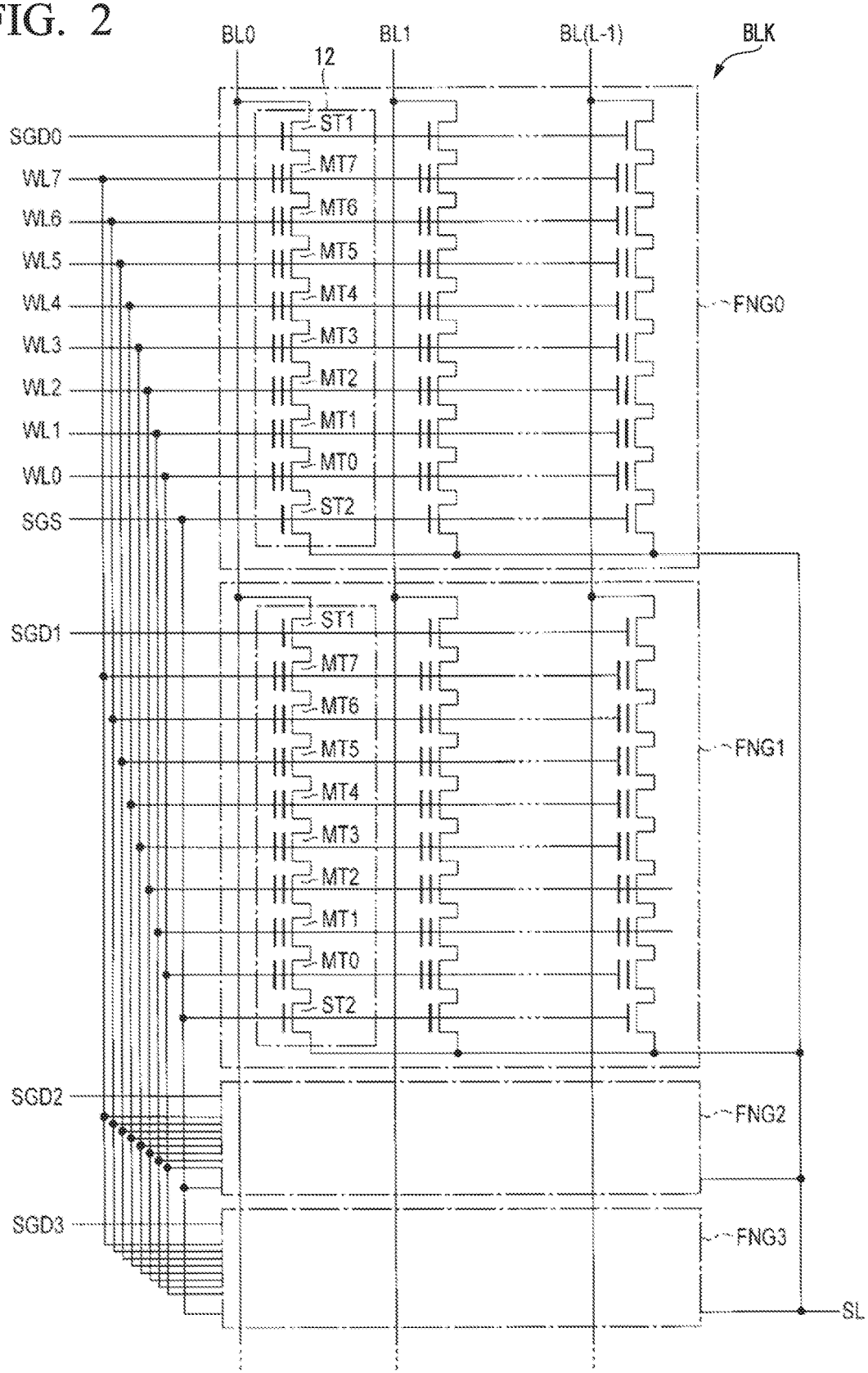
FIG. 2 is a circuit diagram of a block of a memory cell array in the storage device.

FIG. 2 is a circuit diagram of a block BLK. FIG. 2 shows one block BLK, and the configuration of the other blocks BLK may be the same.

In FIG. 2, the block BLK includes four fingers FNG (FNG0 to FNG3). Each of the NAND strings 12 included in each finger FNG includes eight memory cell transistors MT (MT0 to MT7; examples of memory cells) and two control transistors ST (ST1 and ST2).

The control transistor ST1 is connected to one of the bit lines BL (BL0 to BL(L−1), where (L−1) is a natural number of 1 or greater). The control transistor ST1 selectively connects the corresponding bit line BL to the plurality of memory cell transistors MT of the same finger FNG.

The control transistor ST2 is connected to a source line SL. The control transistor ST2 selectively connects the source line SL to the plurality of memory cell transistors MT of the same finger FNG.

Each memory cell transistor MT includes a semiconductor layer, a charge-storing layer, and a gate, and stores data in a non-volatile manner. Memory cell transistors MT of a finger FNG are connected in series between the control transistors ST1 and ST2 of the finger FNG.

The gate of the control transistor ST1 of each of the fingers FNG0 to FNG3 is connected in common to a select gate line SGD (SGD0 to SGD3) provided for each finger. The fingers FNG in the embodiment are an aggregation of NAND strings 12 electrically connected in parallel with respect to one select gate line SGD. The select gate line SGD is connected to the row decoder 20.

In each of the fingers FNG, the memory cell transistors MT are connected to the same word line WLn, where n is the number counting from the control transistor ST2 side. Each word line WLn is connected to a gate of a memory cell transistor MT of a same row in each memory NAND string 12 of a finger. The word lines WL are connected to the row decoder 20.

The gates of the control transistors ST2 of a block BLK is connected in common the same gate line SGS. The gate line SGS is connected to the row decoder 20.

The bit lines BL are connected to the column decoder 30. The bit lines BL are connected in common to NAND strings 12 of a same column across a plurality of fingers FNG and across a plurality of blocks BLK.

The source line SL is connected to the column decoder 30.

Figure 3:
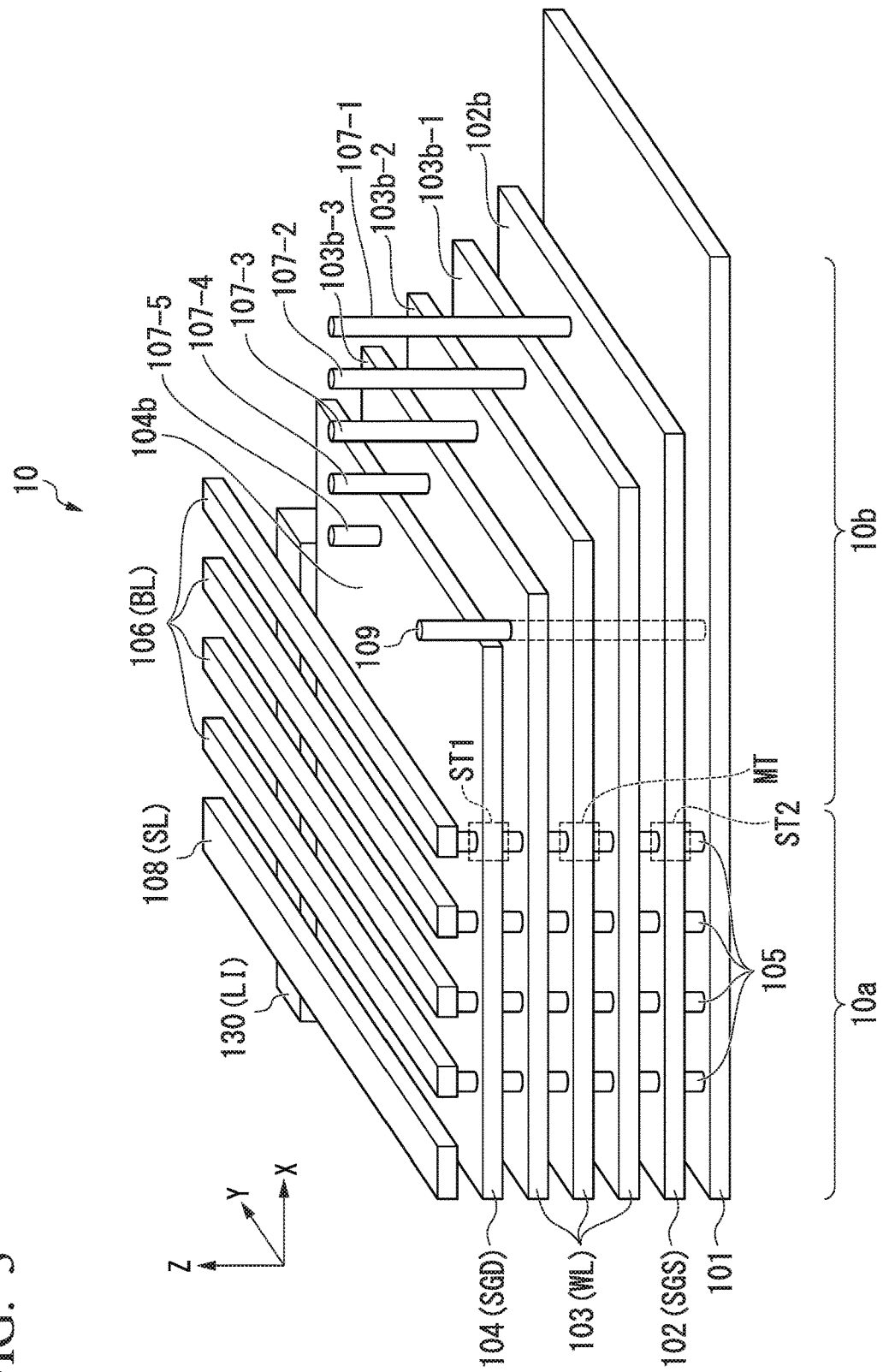
FIG. 3 is a perspective view of a portion of the memory cell array.

FIG. 3 is a perspective view of a memory cell array. In the following, when necessary, XYZ coordinates are used in the illustration.

The memory cell array 10 includes a semiconductor layer 101 and a plurality of conductive layers 102 to 104. The plurality of conductive layers 102 to 104 is stacked in Z direction (stacking direction or thickness direction) on the semiconductor layer 101 in a memory cell region 10a and a peripheral region 10b of the memory cell array 10. The conductive layers 102 to 104 are formed of, for example, tungsten (W) or polysilicon (poly-Si) or the like. The memory cell array 10 includes a stack CF of films in the periphery around the conductive layers 102 to 104. An interlayer insulating film 120 is disposed above and below each of the conductive layer 102 to 104 on which the stack CF of films is formed. These elements are omitted in FIG. 3 and described in FIG. 4.

The conductive layer 102 correspond to the gate line SGS. The conductive layers 103 correspond to the word lines WL. The conductive layer 104 corresponds to the select gate lines SGD.

In the memory cell array 10, a plurality of memory pillars 105 extending in Z direction is arranged with a prescribed pitch in X direction. At each intersection between the conductive layers 102 and the memory pillar 105, the control transistor ST2 is formed. At each intersection between the conductive layer 103 and the memory pillar 105, the memory cell transistor MT is formed. At each intersection between the conductive layer 104 and the memory pillar 105, the control transistor ST1 is formed.

Figure 4:
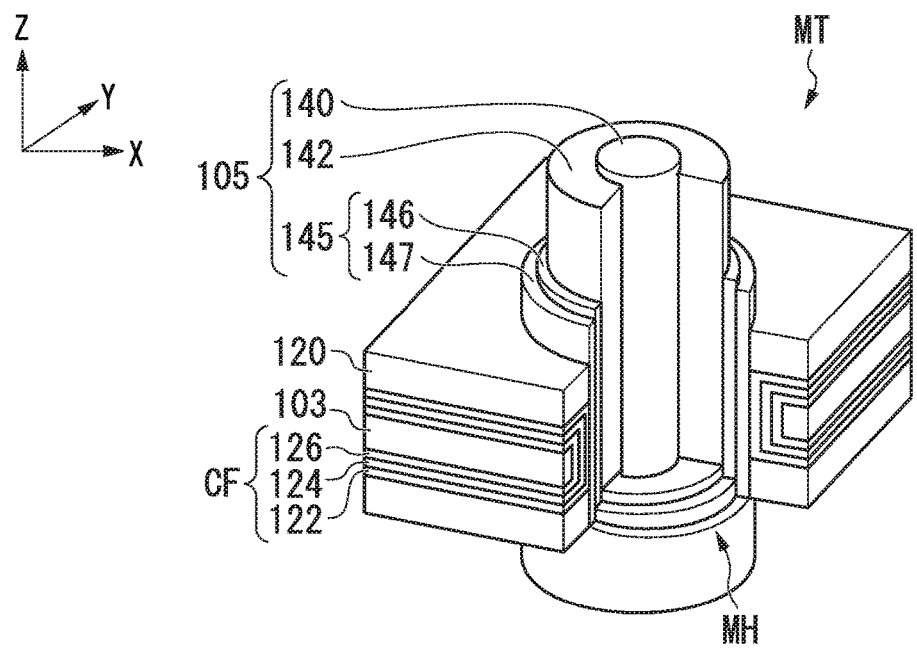
FIG. 4 is a perspective view of a memory cell transistor.

FIG. 4 is a perspective view of a memory cell transistor MT. The stack CF of films is formed in the periphery around the conductive layers 103. Interlayer insulating films 120 are disposed above and below the conductive layers 103 around which the stack CF of films is formed and electrically insulates between the conductive layers 103. The interlayer insulating films 120 are formed of an insulating material such as silicon oxide ($SiO_2$).

A memory hole MH is formed in the conductive layer 103 and the interlayer insulating films 120 so as to pass through the stack of the conductive layers 103 and the interlayer insulating films 120 adjacent thereto. Memory holes MH are arranged within the XY plane of the memory cell array 10. A memory pillar 105 is disposed in each memory hole MH.

The memory pillar 105 has, from the center to the periphery, a core insulating layer 140, a semiconductor layer 142, and a memory layer 145. The memory layer 145 includes, from the side surface side of the semiconductor layer 142, a tunnel insulation layer 146 and a charge-storing layer 147. The stack CF of films includes, from the side surface side of the memory layer 145, a blocking insulation film 122, a blocking high-dielectric film 124, and a barrier metal 126.

In the memory cell transistor MT, the semiconductor layer 142 serves as a channel and the conductive layer 103 serves as the gate. The memory cell transistor MT stores data by changing the threshold by the amount of electrons stored in the charge-storing layer 147. When a prescribed voltage is applied to the gate, the memory cell transistor MT writes information by storing electrons in the charge-storing layer 147.

The tunnel insulating film 146 and the blocking insulation film 122 are formed of, for example, silicon oxide ($SiO_2$). The charge-storing layer 147 is formed of, for example, silicon nitride (SiN). The blocking high-dielectric film 124 is formed of, for example, a metal oxide such as alumina ($Al_2O_3$) or hafnium oxide ($HfO_x$). The barrier metal 126 is formed of, for example, a metal nitride such as TiN, WN, or TaN. The intersection part of the conductive layer 102 or 104 and the memory pillar 105 may be formed in the same manner as the intersection parts of the conductive layer 103 and the memory pillar 105.

Returning to FIG. 3, the plurality of conductive layers 102 to 104 is formed in a stepped manner in the peripheral region 10b. The conductive layers 102 to 104 include contact regions 102b, 103b-1, 103b-2, 103b-3, and 104b, respectively, each of which does not face the other conductive layers 102 to 104 positioned thereabove. Contact plugs 107-1, 107-2, 107-3, 107-4, and 107-5 are disposed midway in Y direction in the contact regions 102b to 104b, respectively. Interconnects (not shown) are disposed at the upper ends (Z direction) of the contact plugs 107-1 to 107-5. The contact plugs 107-1 to 107-5 and the interconnects are formed of, for example, tungsten (W).

The memory cell array 10 also includes a plurality of conductive lines 106 positioned above the memory pillars 105 and extending in Y direction. The plurality of conductive lines 106 is arranged in X direction. The memory pillars 105 are electrically connected to lower surfaces of the conductive lines 106. The conductive lines 106 correspond to a plurality of bit lines BL provided in parallel. The conductive lines 106 are formed of, for example, tungsten (W).

The memory cell array 10 also includes a conductive line 108 that extends in Y direction above the conductive layer 104 and is disposed in −X direction relative to the conductive lines 106. A conductive layer 130 is electrically connected to the lower surface of the conductive line 108 in Z direction. The conductive line 108 corresponds to the source line SL. The conductive line 108 is formed of, for example, tungsten (W).

The conductive layer 130 extends in X direction and faces side surfaces of the plurality of conductive layers 102 to 104 in −Y direction. The lower surface of the conductive layer 130 in Z direction contacts the semiconductor substrate 101. The upper surface of the conductive layer 130 in Z direction contacts the conductive line 108. The conductive layer 130 corresponds to the source contact LI. The conductive layer 130 is formed of, for example, tungsten (W). The conductive layer 130 (source contact LI) contributes to make the NAND string 12 conductive through the conductive layer (SGD) 102 to the conductive layer (SGS) 104.

The memory cell array 10 also includes a beam pillar 109. The beam pillar 109 maintains positions of the interlayer insulating films 120 disposed between the conductive layers 102 to 104 during the manufacturing process of the memory cell array 10.

Figure 5:
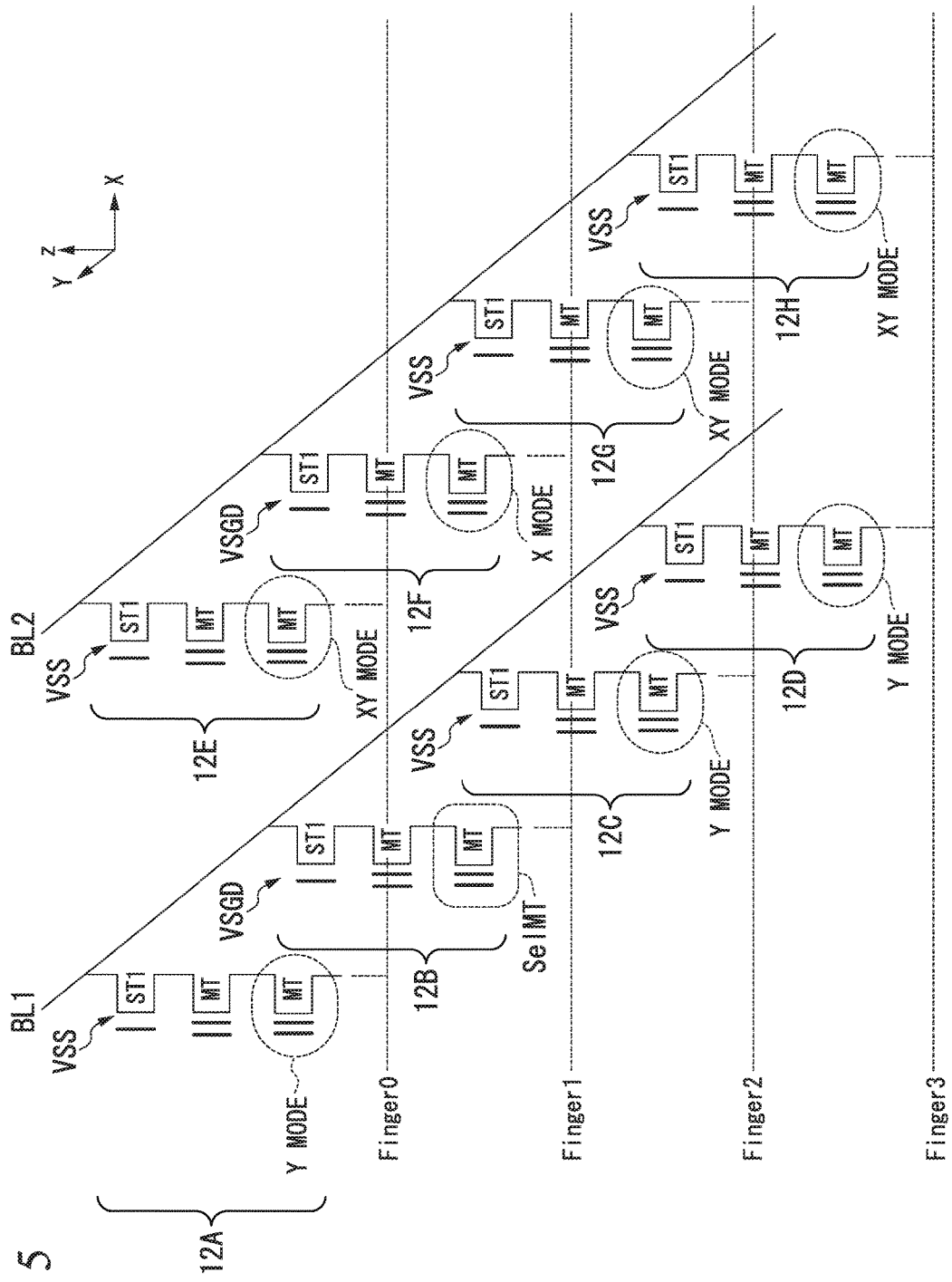
FIG. 5 is a circuit diagram of a partial equivalent circuit of the memory cell array.

The partial equivalent circuit of the memory cell array 10 will be described below with reference to FIG. 5. FIG. 5 illustrates only a portion of the memory cell array 10. Some of the memory cell transistors MT, the control transistor ST2, and the word lines WL that are included in the NAND string 12 (12A to 12H) are omitted in FIG. 5.

In the following description, a memory cell transistor MT selected for writing (SelMT in FIG. 5) will be called a selected memory cell transistor, and a memory cell transistor MT that is not selected for writing will be called a non-selected memory cell transistor. Zero voltage need not strictly equal to the ground potential, and can be a potential that is approximately the same as the ground terminal connected to the storage device 1.

In FIG. 5, the bit line BL1 corresponds to the selected bit line BL, the finger FNG1 connected to the selected select gate line SGD corresponds to the selected finger FNG, and the NAND string 12B corresponds to the selected NAND string 12, and the other elements correspond to non-selected select gate line, fingers, and NAND strings.

Figure 6:
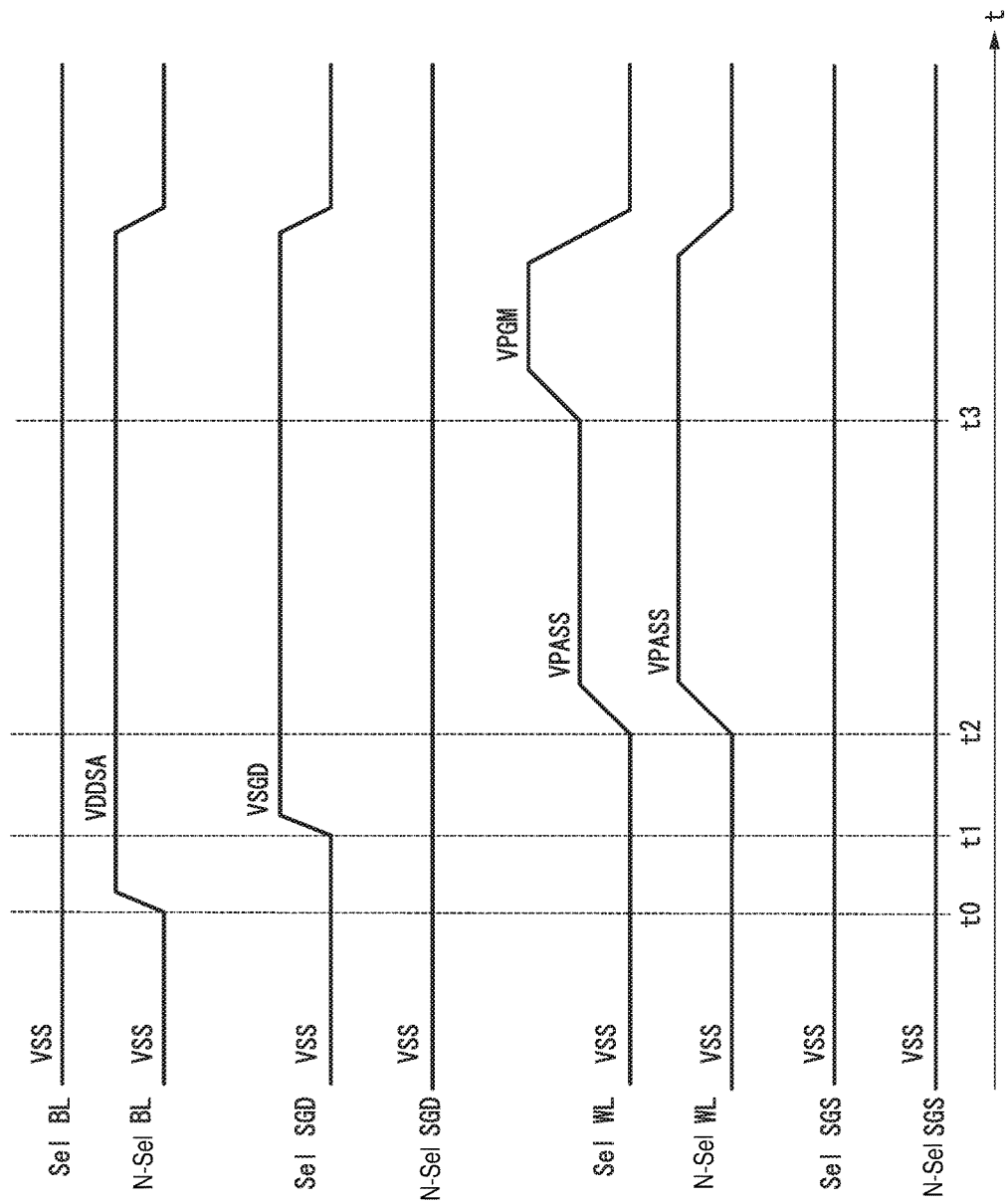
FIG. 6 is a timing chart of a write operation according to a comparison example.

FIG. 6 is a timing chart of a write operation according to a comparison example. With reference to FIG. 6, Y mode, X mode, and XY mode of the comparison example are described below. Also, in FIG. 6 and the following drawings, selected and non-selected are indicated as Sel and N-sel, respectively.

The selected NAND string 12B will first be described.

When data are written, a zero voltage (Low voltage indicated as VSS in FIG. 6) is applied to the selected bit line BL (time t0).

By applying voltage VSGD (High voltage) to the selected select gate line SGD to place the selected control transistor ST1 into the conducting state, the zero voltage is applied to the channel of the selected memory cell transistor MT (t1).

Voltage VPASS (pass voltage) is applied to the selected word line WL and the non-selected word lines WL (t2). Because the selected control transistor ST1 is in the conducting state, the selected memory cell transistor MT is not boosted. Boosting will be described below.

Then, voltage VPGM (program voltage) is applied to the selected word line WL (t3). Because a voltage is applied between the gate electrode and the channel of the selected memory cell transistor MT, data are written into the selected memory cell transistor MT of the selected NAND string 12B (t3). The voltage VPGM is a voltage level that is sufficient to inject a charge into the charge-storing layer of the memory cell transistor MT, by generating an electric field between the charge-storing layer and the channel, and is higher than the voltage VPASS. During the processing shown in FIG. 6, the potential of the gate line SGS of the source-side control transistor STS is maintained at the zero voltage.

Next, the non-selected NAND strings 12A, 12C, and 12D connected to the selected bit line BL, the non-selected select gate lines SGD, and the non-selected word lines WL will be described with reference to FIG. 6.

A zero voltage is applied to the selected bit line BL (t0). The non-selected select gate lines SGD is maintained at the zero voltage. That is, the non-selected control transistors ST1 are in the cut-off state.

By applying the voltage VPASS to the selected word line WL and the non-selected word lines WL, the memory cell transistors MT of the non-selected NAND string 12A, 12C, and 12D are boosted (t2). Boosting refers to the maintaining the channel potential at an elevated level. As a result, even if the voltage VPGM (program voltage) is applied to the selected word line WL at time t3, data are not written into the memory cell transistors MT of the non-selected NAND string 12A, 12C, and 12D.

In this case, in the non-selected NAND string 12A, 12C, and 12D connected to the selected bit line BL1, the selected bit line BL1 is maintained at a zero voltage, and the voltage VPASS is applied to the selected word line WL and the non-selected word lines WL. As a result, a voltage is generated across the terminals of the control transistor ST1. Thus, because the control transistor ST1 is no longer in the cut-off state and current flows therethrough, boost leakage may occur in the memory cell transistor MT. Boost leakage refers to drop of the channel potential. When the boost leakage occurs, because the word line WL is connected in common between fingers FNG, when the voltage VPGM is applied to the selected word line WL in the state in which the channel potential of a non-selected memory cell transistor MT connected to a selected word line WL dropped, erroneous writing (Y mode) can occur.

Next, the non-selected NAND string 12F connected to non-selected bit lines BL, the selected select gate line SGD, and the selected word line WL will be described with reference to FIG. 6.

The voltage VDDSA (High voltage) is applied to the non-selected bit lines BL (t0). At this time, if the potential difference between the voltage VDDSA (High voltage) and the voltage VSGD (High voltage) applied to the selected select gate line SGD is less than the threshold voltage of the selected control transistor ST1, the selected control transistor ST1 turns into the cut-off state.

The voltage VPASS is applied to the selected word line WL and the non-selected word lines WL (t2). That is, memory cell transistors MT of the NAND string 12F are boosted. As a result, even if the voltage VPGM is applied to the selected word line WL at time t3, data are not written into the memory cell transistors MT of the NAND string 12F.

In this case, in the non-selected NAND string 12F connected to the non-selected bit line BL1, similarly to the non-selected NAND string 12A, 12C, and 12D, a voltage is generated across the terminals of the control transistor ST1. As the control transistor ST1 is no longer in the cut-off state, boost leakage may occur in the memory cell transistor MT. That is, data may be erroneously written (X mode) into the non-selected memory cell transistors MT of the non-selected NAND string 12F.

Because the voltage VDDSA (High voltage) is applied to the non-selected bit line BL2, the voltage generated across of the terminals of the control transistor ST1 is smaller than in the non-selected NAND string 12A, 12C, and 12D. That is, current is less likely to flow in the control transistor ST1 that is in the cut-off state due to the voltage across the terminals of the control transistor ST1. That is, the X mode is less likely to occur than the Y mode.

Next, the non-selected NAND string 12E, 12G, and 12H connected to the non-selected bit lines BL, the non-selected select gate lines SGD, and the non-selected word lines WL will be described with reference to FIG. 6.

The voltage VDDSA (High voltage) is applied to the non-selected bit lines BL (t0). The non-selected select gate lines SGD are maintained at the zero voltage (Low voltage). That is, the control transistors ST1 of the non-selected NAND string 12E, 12G, and 12H are in the cut-off state.

By applying the voltage VPASS to the selected word line WL and the non-selected word lines WL, the memory cell transistors MT of the non-selected NAND string 12E, 12G, and 12H are boosted (t2). As a result, even if the voltage VPGM is applied to the selected word line WL at time t3, data are not written into the memory cell transistors MT of the non-selected NAND string 12E, 12G, and 12H.

In this case, in the non-selected NAND string 12E, 12G, and 12H connected to the non-selected bit line BL2, similarly to the non-selected NAND string 12A, 12C, and 12D, a voltage is generated across the terminals of the control transistor ST1, and boost leakage may occur. That is, erroneous writing (mode XY) into the non-selected memory cell transistors MT of the non-selected NAND string 12E, 12G, and 12H ma occur.

Similar to the X mode, because the voltage VDDSA (High voltage) is applied to the non-selected bit line BL2, the voltage generated across the terminals of the control transistor ST1 is smaller than voltage generated in the non-selected NAND string 12A, 12C, and 12D. That is, the XY mode is less likely to occur than the Y mode.

Summarizing the foregoing, in the non-selected NAND string 12A, 12C, and 12D, there is a possibility of erroneous writing (Y mode). This erroneous writing (Y mode) occurs more easily than the erroneous writing (X mode and XY mode) occurring in the other non-selected NAND string 12E, 12F, 12G and 12H. Stated differently, the reliability of the storage device 1 can be improved by reducing the Y mode.

Figure 7:
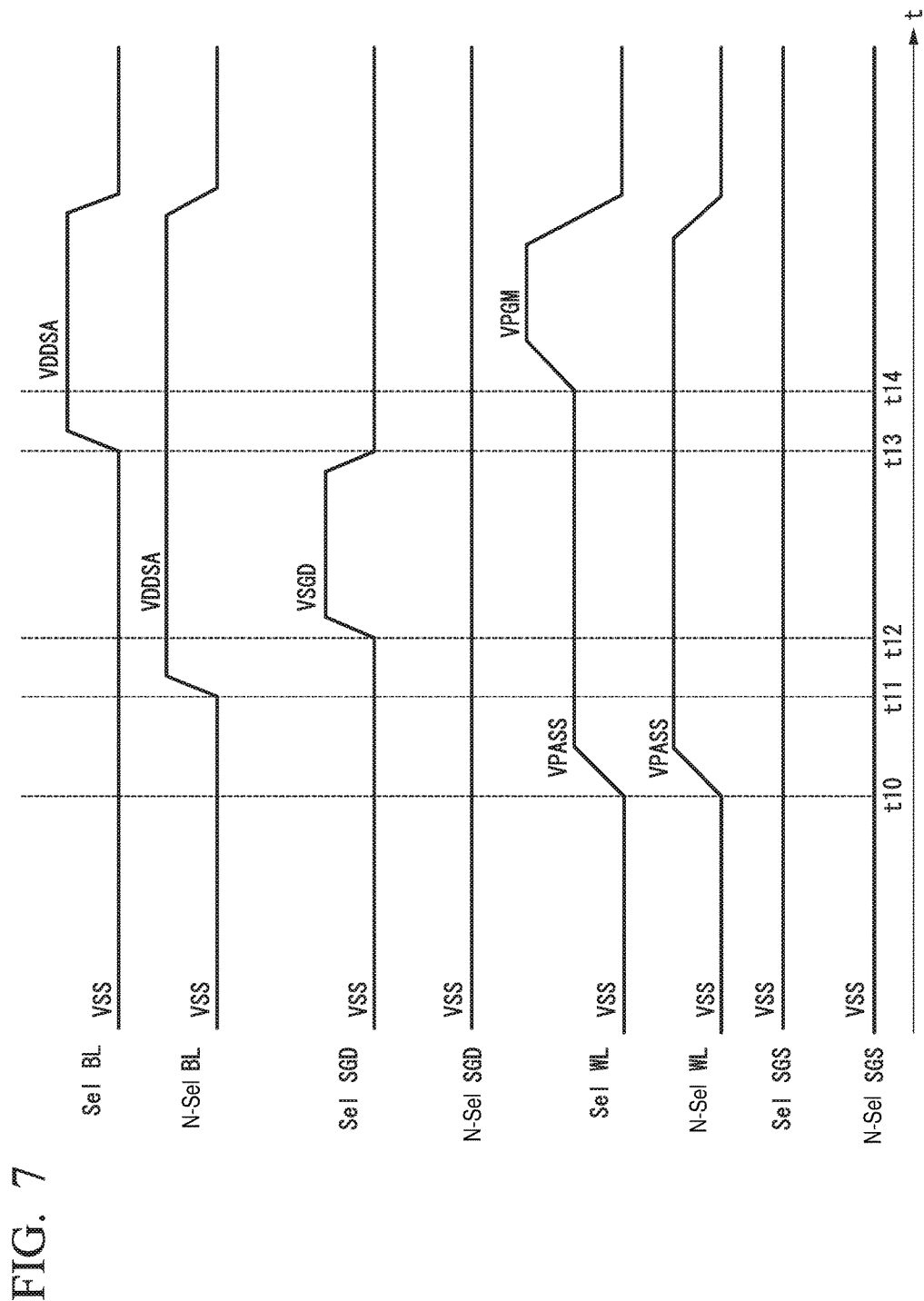
FIG. 7 is a timing chart of a write operation according to the first embodiment.

Next, a write operating according to the first embodiment will be described. FIG. 7 is a timing chart of a write operation according to the first embodiment. First, the selected NAND string 12B will be described with reference to FIG. 7.

In the case of writing data, the core driver 60 applies the voltage VPASS to the selected word line WL (t10). This boosts the memory cell transistors MT of the selected NAND string 12B. At this time, the selected bit line BL is maintained at a zero voltage.

In this state, the core driver 60 applies the voltage VSGD (High voltage) to the selected select gate line SGD at a pre-established time (t12). Because the selected control transistor ST1 is in the conducting state, the channels of the memory cell transistors MT of the selected NAND string 12B are maintained at the zero voltage. That is, memory cell transistors MT of the selected NAND string 12B turn into the non-boosted state.

The core driver 60 applies the voltage VDDSA (High voltage), which is higher than the zero voltage (Low voltage), to the selected bit line BL during a pre-established time after the voltage applied to the select gate line SGD of the selected finger FNG is set to the zero voltage (t13). Because the control transistor ST1 of the selected NAND string 12B is in the cut-off state, the voltage VDDSA (High voltage) does not reach the memory cell transistors MT of the selected NAND string 12B.

With the voltage VDDSA (High voltage) applied to the selected bit line BL, the core driver 60 applies the voltage VPGM to the selected word line WL (t14), thereby writing data into the selected memory cell transistor MT.

Next, the non-selected NAND string 12A, 12C, and 12D connected to the selected bit line BL, the non-selected select gate lines SGD, and the non-selected world lines WL will be described with reference to FIG. 7.

The core driver 60 applies the voltage VPASS to the selected word line WL and the non-selected word lines WL (t10). This boosts the memory cell transistors MT of the non-selected NAND string 12A, 12C, and 12D. As a result, even if the voltage VPGM is applied to the selected word line WL at time t14, data are not written into the non-selected memory cell transistors MT. The non-selected select gate lines SGD is maintained at the zero voltage.

At time t13, which is before time t14 at which the voltage VPGM is applied to the selected word line WL, because voltage VDDSA (High voltage) is applied to the selected bit line BL, at the point at which the voltage VPGM is applied to the selected word line WL, the voltage generated across the terminals of the control transistor ST1 of the non-selected NAND string 12A, 12C, and 12D is smaller than that of the example shown in FIG. 6. As a result, it is possible to suppress boost leakage and the occurrence of the Y mode.

Next, the non-selected NAND string 12F connected to the non-selected bit lines BL the selected select gate line SGD, and the selected word line WL will be described with reference to FIG. 7.

The core driver 60 applies the voltage VPASS to the selected word line WL and the non-selected word lines WL (t10). This boosts the memory cell transistors MT in the non-selected NAND string 12F. The voltage VDDSA (High voltage) is applied to the non-selected bit lines BL (t11), and the voltage VSGD is applied to the selected select gate line SGD (t12). If the potential difference between the voltage VDDSA (High voltage) and the voltage VSGD applied to the selected select gate line SGD is less than the threshold voltage of the selected control transistor ST1, the selected control transistor ST1 turns into the cut-off state. As a result, even if the voltage VPGM is applied to the selected word line WL at time t14, data are not written into the memory cell transistors MT of the NAND string 12F.

Next, the non-selected NAND string 12E, 12G, and 12H connected to the non-selected bit lines BL, the non-selected select gate lines SGD, and the non-selected word lines WL will be described with reference to FIG. 7.

The core driver 60 applies the voltage VPASS to the selected word line WL and the non-selected word lines WL (t10). This boosts the memory cell transistors MT of the non-selected NAND string 12E, 12G, and 12H. The non-selected select gate lines SGD are maintained at a zero voltage. The voltage VDDSA (High voltage) is applied to the non-selected bit lines BL (t11).

As a result, even if the voltage VPGM is applied to the selected word line WL at time t14, data are not written into the memory cell transistors MT of the non-selected NAND string 12E, 12G, and 12H.

During the processing shown in FIG. 7, the potential of the gate line SGS of the source-side control transistor STS is maintained at the zero voltage.

According to the first embodiment described above, by reducing the voltage applied between the terminals of the non-selected control transistors ST1 connected to the selected bit line BL1, it is possible to suppress boost leakage at the non-selected memory cell transistors MT and suppress the occurrence of the Y mode.

Second Embodiment

A storage device 1 according to a second embodiment will be described below. The storage device 1 according to the second embodiment performs a verify operation with respect to a selected memory cell transistor MT that includes the voltage VPGM applied thereto. The verify operation is an operation of determining whether or not a data write operation to the selected memory cell transistor MT has been performed correctly. In the following, points different from the first embodiment will be mainly described, and descriptions of common parts will be omitted.

Figure 8:
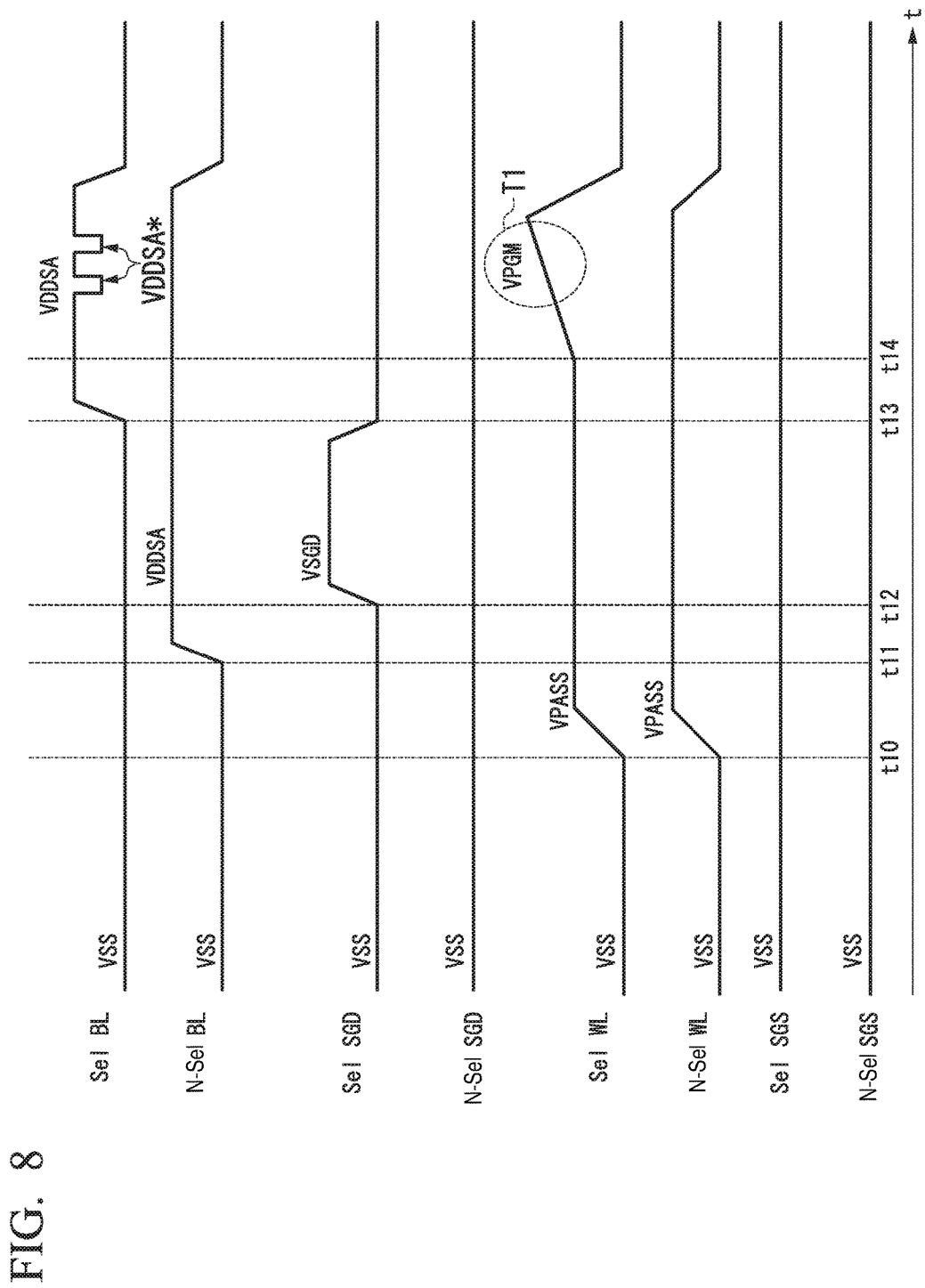
FIG. 8 is a timing chart of a write operation according to a second embodiment.

FIG. 8 is a timing chart of a write operation according to the second embodiment. At the timing of the write operation, the core driver 60 applies, to the selected bit line BL, the voltage VDSA*, which is lower than the voltage VDDSA applied to the selected bit line BL and, in synchronization therewith, the core driver 60 applies, to the selected word line WL, a voltage that is lower than the voltage VPGM, in order to execute a verify operation of the selected memory cell transistor MT. The verify operation enables determination of whether or not a data write operation to the selected memory cell transistor MT has been performed correctly. When performing the verify operation, the core driver 60 alternately applies the voltages VDDSA and VDDSA* to the selected bit line BL.

Before the core driver 60 alternately applies the voltages VDDSA and VDDSA* to the selected bit line BL, the core driver 60 applies, to the selected word line WL, a write pulse that tends to increase in voltage in accordance with the passage of time (t14).

Figure 9:
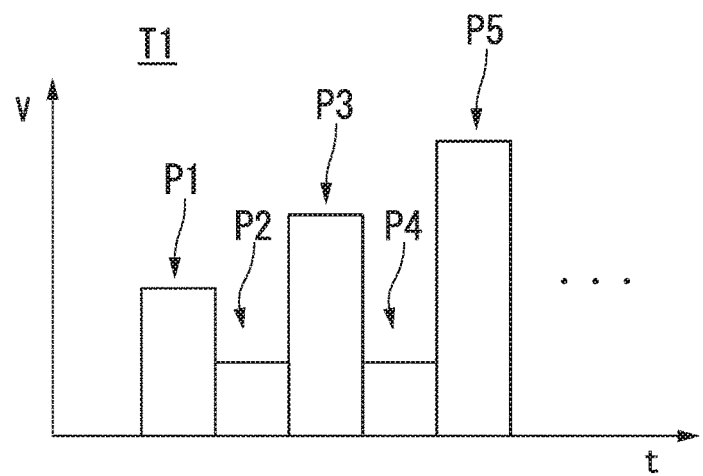
FIG. 9 is an enlarged timing chart of a portion in FIG. 8.

FIG. 9 is an enlarged timing chart of a region in FIG. 8, in which the vertical axis represents voltage, and the horizontal represents time. In FIG. 9, pulses P1, P3, and P5 are the write pulses applied to the selected word line WL at the time of the write operation. In FIG. 9, pulses P2 and P4 are the read-out pulses applied to the selected word line WL to read out during the verify operation. The read-out pulses are voltage signals of a certain voltage. The read-out pulses are supplied with a voltage lower than the lowest voltage among the write pulses. When the read-out pulses P2 and P4 are applied, the selected memory cell transistor MT sends data to the column decoder 30.

According to the second embodiment described above, the storage device 1 achieves the same effect as the first embodiment, and also enables establishment of writing reliability by the verify operation.

Third Embodiment

A storage device 1 according to a third embodiment will be described below. The core driver 60 of the storage device 1 according to the third embodiment, after applying the voltage VSGD to the selected select gate line SGD, applies the voltage VPASS to the selected word line WL and the non-selected word lines WL. In the following, points different from the first and second embodiments will be mainly described, and descriptions of the common parts will be omitted.

Figure 10:
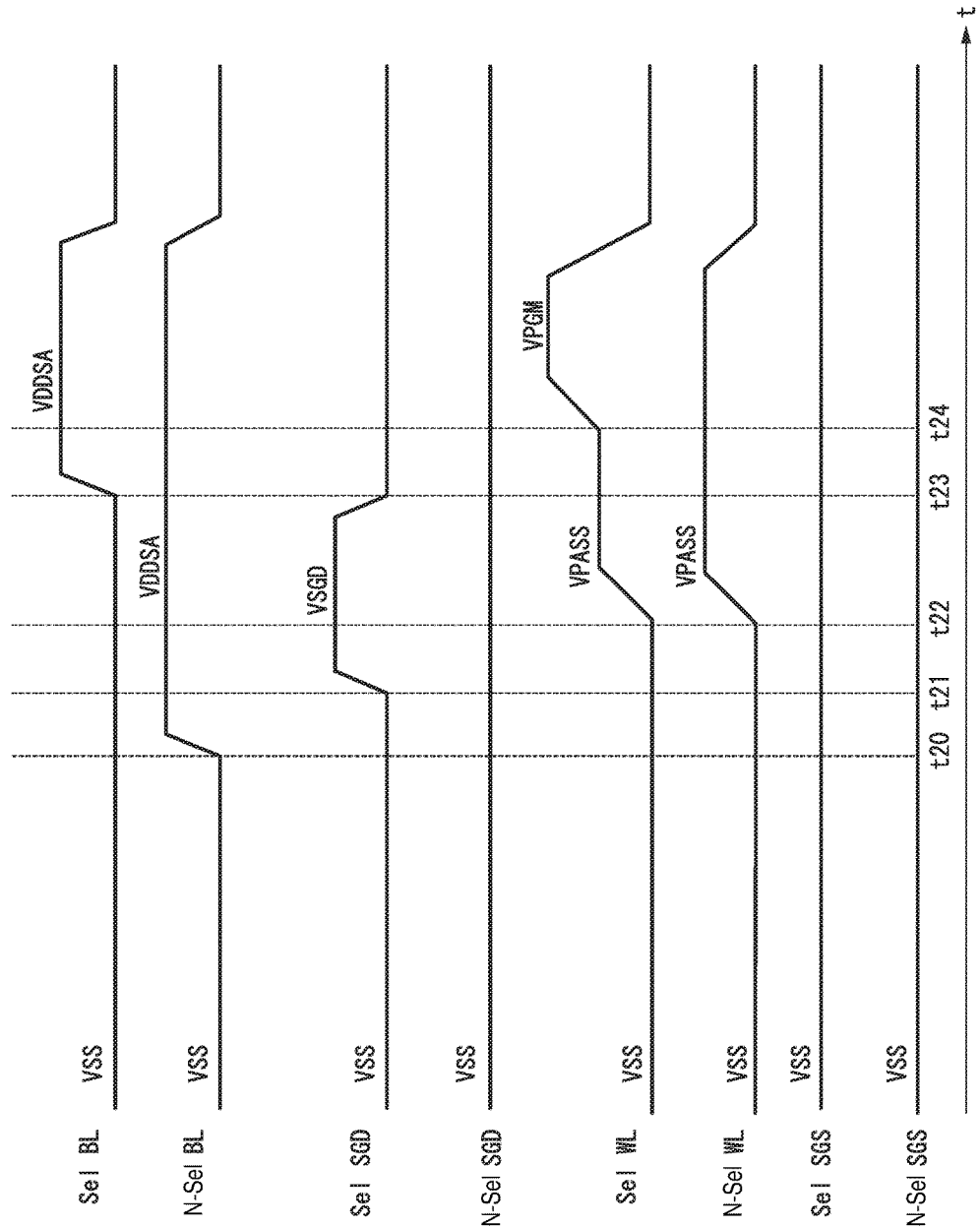
FIG. 10 is a timing chart of a write operation according to a third embodiment.

FIG. 10 is a timing chart of a write operation according to a third embodiment. The operation shown in FIG. 10, in contrast to the operation shown in FIG. 7, the operation of applying the voltage VPASS to the selected word line WL and the non-selected word lines WL is carried out after the operation of applying the voltage VSGD to the selected select gate line SGD after applying the voltage VDDSA to the non-selected bit lines BL. The operation shown in FIG. 10 shortens the time of application of the voltage VPASS to the selected word line WL and the non-selected word lines WL.

According to the third embodiment described above, the time of application of the voltage VPASS to the selected word line WL and the non-selected word lines WL is shortened, thereby achieving not only the same effect as the first embodiment, but also achieving high-speed operation.

Fourth Embodiment

A storage device 1 according to a fourth embodiment will be described. In the storage device 1 according to the fourth embodiment, form of application of voltage to the selected bit line BL differs from that of the first embodiment. In the following, points different from the above embodiments will be mainly described, and descriptions of the common parts will be omitted.

Figure 11:
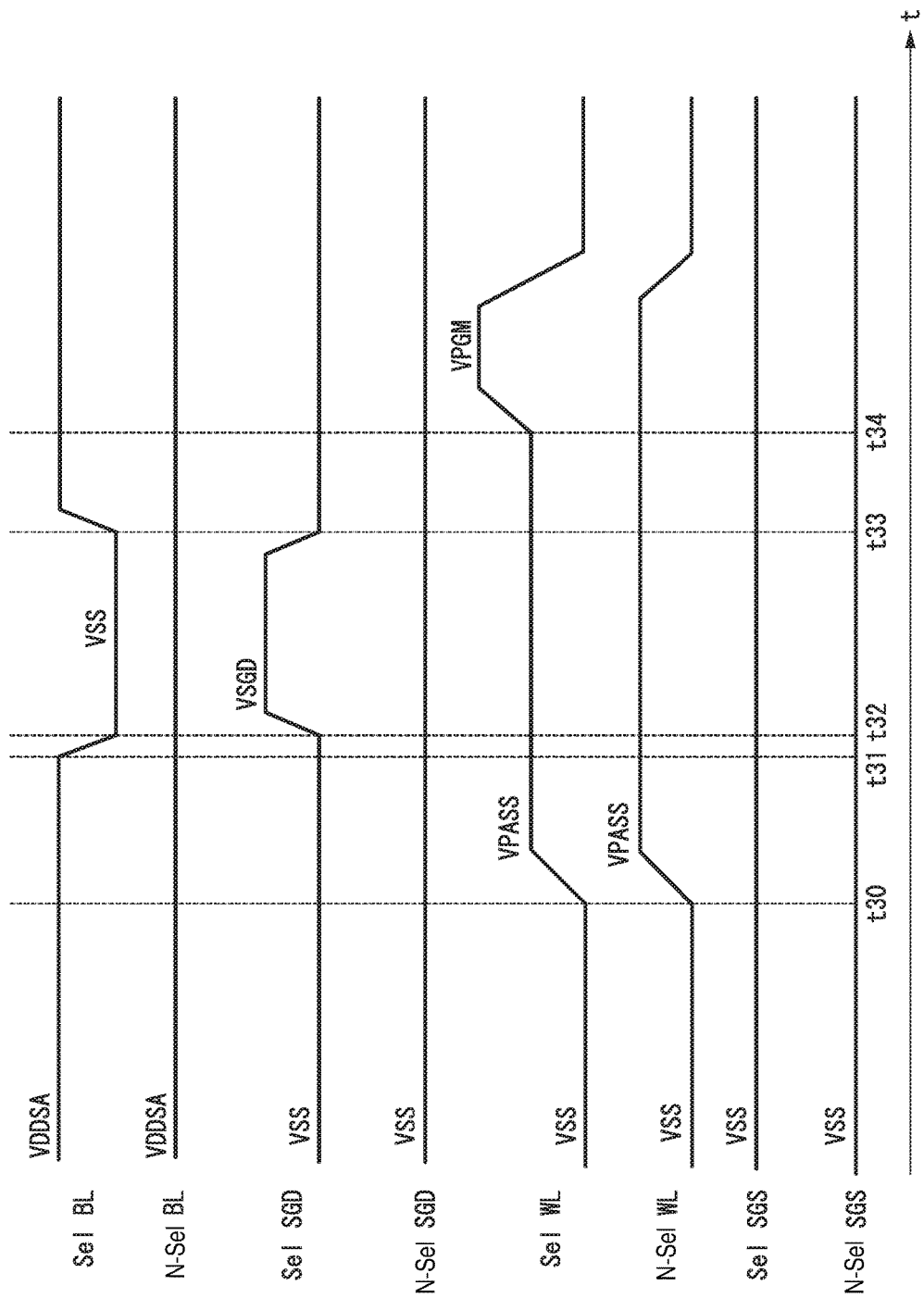
FIG. 11 is a timing chart of a write operation according to a fourth embodiment.

FIG. 11 is a timing chart of a write operation according to the fourth embodiment. The operation shown in FIG. 11, in contrast to the operation shown in FIG. 7, where the voltage VDDSA is applied to the selected bit line BL at the start of writing, the zero voltage is maintained at the start of writing.

According to the fourth embodiment described above, the same effect as the first embodiment is achieved.

Fifth Embodiment

A storage device 1 according to a fifth embodiment will be described below. In the storage device 1 according to the fifth embodiment, between the timing of applying the voltage VPASS to the selected word line WL and the timing of applying the voltage VPGM thereto, a voltage that is higher than the voltage VPASS and lower than the voltage VPGM is applied to the selected word line WL. In the following, points different from the above embodiments will be mainly described, and descriptions of the common parts will be omitted.

Figure 12:
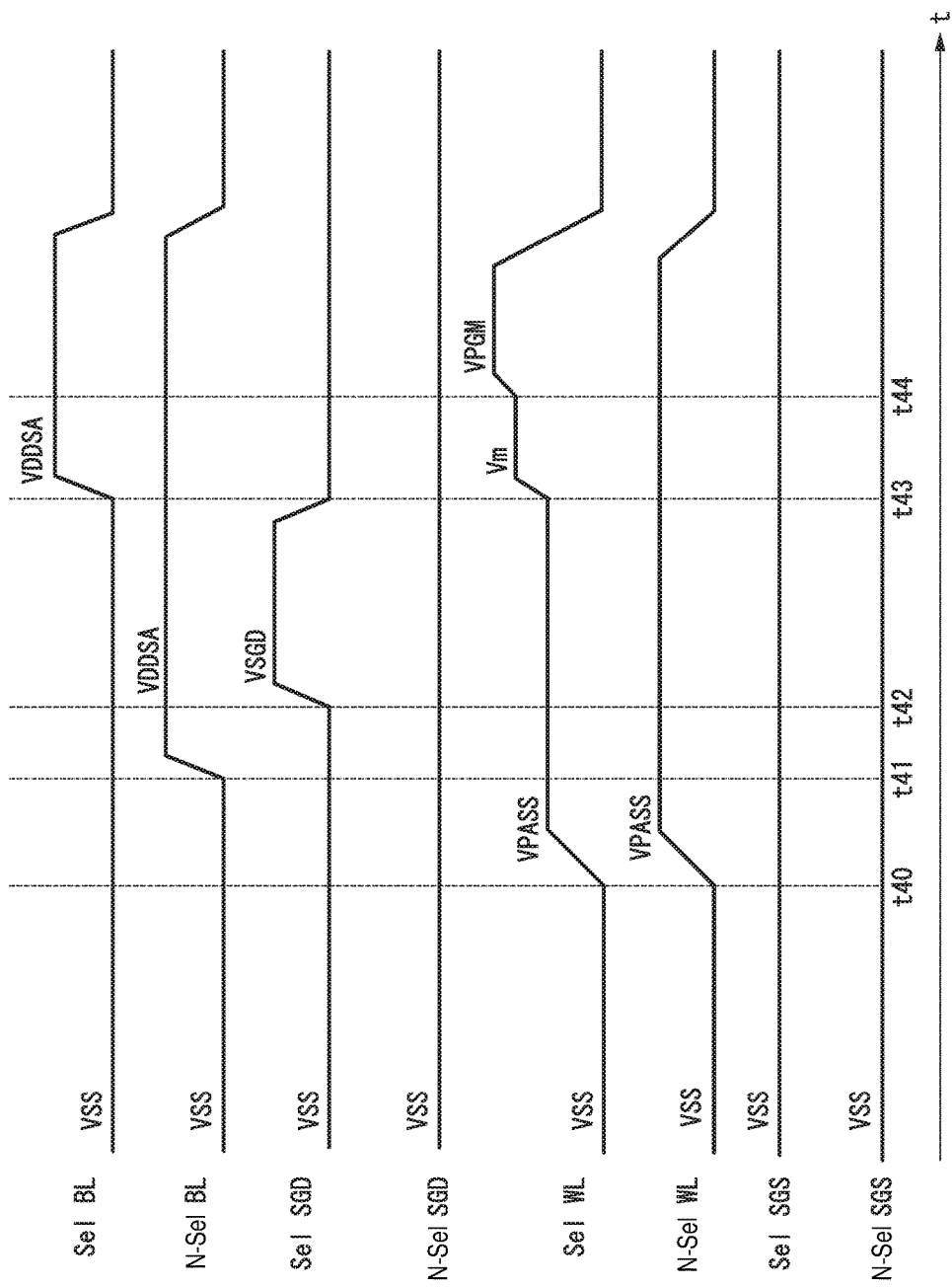
FIG. 12 is a timing chart of a write operation according to a fifth embodiment.

FIG. 12 is a timing chart of a write operation according to the fifth embodiment.

The operation shown in FIG. 12, is different from the operation shown in FIG. 7 in that, at time t43, which is a time earlier than time t44 at which the voltage VPGM is applied to the selected word line WL, a voltage Vm that is higher than the voltage VPASS and lower than the voltage VPGM is applied to the selected word line WL. This prevents a sudden change in the voltage on the selected word line WL, thereby suppressing the occurrence of not only the Y mode, but also the X mode.

According to the fifth embodiment described above, occurrence of not only the Y mode, but also of the X mode and XY mode can be suppressed.

According to at least one of the above-described embodiments, when writing data into a selected memory cell transistor MT, by applying boost voltage to a selected word line while High voltage is applied to the selected bit line, it is possible to suppress the occurrence of erroneous writing.

While certain embodiments have been described, these embodiments have been presented by way of example only, and are not intended to limit the scope of the inventions. Indeed, the novel embodiments described herein may be embodied in a variety of other forms: furthermore various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a plurality of bit lines including a first bit line and a second bit line;
a plurality of memory units that are electrically connected in parallel between each of the plurality of bit lines and a source line, one of the memory units including a first memory string having a plurality of memory cells connected in series, connected to the first bit line, and a second memory string having a plurality of memory cells connected in series, connected to the second bit line;
a plurality of word lines that are each connected in common to a gate of a memory cell in the first memory string and a gate of a memory cell in the second memory string; and
a controller configured to control voltages applied to the bit lines and the word lines during a writing operation, wherein
when the writing operation is performed on a selected memory cell of the first memory string to write data into the selected memory cell by increasing a threshold voltage of the selected memory cell, a first voltage is applied to a selected word line that is connected to the gate of the selected memory cell while a second voltage higher than a zero voltage is applied to the first bit line.

2. The storage device according to claim 1, wherein
the first memory string includes a first control transistor connected between the first bit line and the memory cells thereof and the second memory string includes a second control transistor connected between the second bit line and the memory cells thereof, and
during the writing operation performed on the selected memory cell of the first memory string and prior to the second voltage being applied to the first bit line, a third voltage is applied to gates of the first and second control transistors to turn on the first and second control transistors and a fourth voltage is applied to the gates of the first and second control transistors to turn off the first and second control transistors.

3. The storage device according to claim 2, wherein the first and second control transistors remains off while the second voltage is applied to the first bit line.

4. The storage device according to claim 3, wherein
during the writing operation performed on the selected memory cell of the first memory string, the second voltage is applied to the second bit line while the third voltage is applied to the gates of the first and second control transistors and remains applied to the second bit line while the second voltage is applied to the first bit line.

5. The storage device according to claim 2, wherein
during the writing operation performed on the selected memory cell of the first memory string and prior to the third voltage being applied to gates of the first and second control transistors, a pass voltage that is higher than a zero voltage and lower than the first voltage is applied to the selected word line and to non-selected word lines connected to gates of other memory cells in the first memory string.

6. The storage device according to claim 1, wherein
during the writing operation performed on the selected memory cell of the first memory string, the second voltage is applied to the second bit line before the second voltage is applied to the first bit line, and remains applied to the second bit line while the second voltage is applied to the first bit line.

7. The storage device according to claim 6, wherein
during the writing operation performed on the selected memory cell of the first memory string and prior to the second voltage being applied to the second bit line, a pass voltage that is higher than a zero voltage and lower than the first voltage is applied to the selected word line and non-selected word lines connected to gates of other memory cells in the first memory string.

8. The storage device according to claim 7, wherein the second voltage applied to the first bit line is maintained at a constant level for a period of time and a voltage applied to the selected word line transitions from the pass voltage to the first voltage during the period of time.

9. The storage device according to claim 8, wherein the second voltage applied to the first bit line is maintained at a constant level for a period of time and a voltage applied to the selected word line transitions from the pass voltage to an intermediate voltage between the pass voltage and the first voltage and then to the first voltage during the period of time.

10. The storage device according to claim 6, wherein
during the writing operation performed on the selected memory cell of the first memory string, a pass voltage that is higher than a zero voltage and lower than the first voltage is applied to the selected word line and non-selected word lines connected to gates of other memory cells in the first memory string, after the second voltage is applied to the second bit line and prior to the second voltage is applied to the first bit line.

11. The storage device according to claim 1, wherein another one of the memory units includes:
a third memory string having a plurality of memory cells connected in series, connected to the first bit line, and a third control transistor connected between the first bit line and the memory cells thereof; and
a fourth memory string having a plurality of memory cells connected in series, connected to the second bit line, and a fourth control transistor connected between the second bit line and the memory cells thereof, wherein
during the writing operation performed on the selected memory cell of the first memory string, a fourth voltage is applied to the gates of the third and fourth control transistors to turn off the third and fourth control transistors.

12. The storage device according to claim 11, wherein the plurality of word lines are each connected in common to a gate of a memory cell in the third memory string and a gate of a memory cell in the fourth memory string.

13. The storage device according to claim 1, wherein
during the writing operation performed on the selected memory cell of the first memory string and after the second voltage is applied to the first bit line, the second voltage applied to the first bit line is maintained at a constant level until the writing operation ends.

14. The storage device according to claim 13, wherein the first voltage applied to the selected word line is maintained at a constant level until the writing operation ends.

15. The storage device according to claim 1, wherein
during the writing operation performed on the selected memory cell of the first memory string and after the second voltage is applied to the first bit line, the second voltage applied to the first bit line is maintained at a constant level for a period of time and then pulsed between a voltage level equal to the second voltage and a voltage level lower than the second voltage until the writing operation ends.

16. The storage device according to claim 15, wherein the first voltage applied to the selected word line increases while the second voltage applied to the first bit line is pulsed.

17. A storage device comprising:
a plurality of bit lines including a first bit line and a second bit line;
a plurality of memory units that are electrically connected in parallel between each of the plurality of bit lines and a source line, one of the memory units including a first memory string having a plurality of memory cells connected in series, connected to the first bit line, and a second memory string having a plurality of memory cells connected in series, connected to the second bit line;
a plurality of word lines that are each connected in common to a gate of a memory cell in the first memory string and a gate of a memory cell in the second memory string; and
a controller configured to control voltages applied to the bit lines and the word lines during a writing operation, wherein
when the writing operation is performed on a selected memory cell of the first memory string to write data into the selected memory cell by increasing a threshold voltage of the selected memory cell, a first voltage is applied to a selected word line that is connected to the gate of the selected memory cell while a second voltage higher than a zero voltage is applied to the first bit line and the second bit line.

18. The storage device according to claim 17, wherein the first memory string includes a first control transistor connected between the first bit line and the memory cells thereof and the second memory string includes a second control transistor connected between the second bit line and the memory cells thereof, and
during the writing operation performed on the selected memory cell of the first memory string and prior to the first voltage being applied to the selected word line, a third voltage is applied to gates of the first and second control transistors to turn on the first and second control transistors while a zero voltage is applied to the first bit line and the second voltage is applied to the first bit line.

19. The storage device according to claim 18, wherein after the third voltage is applied to the gates of the first and second control transistors for a period of time, a fourth voltage is applied to the gates of the first and second control transistors to turn off the first and second control transistors prior to the first voltage being applied to the selected word line, and the second voltage is applied to the first bit line at the time the fourth voltage is applied to the gates of the first and second control transistors.

20. A storage device comprising:
first and second bit lines;
a first memory string connected to the first bit line and having a plurality of memory cells connected in series;
a second memory string connected to the second bit line and having a plurality of memory cells connected in series;
a plurality of word lines that are each connected in common to a gate of a memory cell in the first memory string and a gate of a memory cell in the second memory string; and
a controller configured to control voltages applied to the bit lines and the word lines during a writing operation, wherein
when the writing operation is performed on a selected memory cell of the first memory string to write data into the selected memory cell by increasing a threshold voltage of the selected memory cell, a first voltage is applied to a selected word line that is connected to the gate of the selected memory cell while a second voltage higher than a zero voltage is applied to the first bit line at a first timing and to the second bit line at a second timing,
wherein the second timing is earlier than the first timing and the first timing is earlier than when the first voltage is applied to the selected word line.

* * * * *